(12) United States Patent
Blum et al.

(10) Patent No.: US 6,677,106 B2
(45) Date of Patent: Jan. 13, 2004

(54) METHOD AND EQUIPMENT FOR USING PHOTO- OR THERMALLY IMAGABLE, NEGATIVELY WORKING PATTERNING COMPOSITIONS

(75) Inventors: Oliver Richard Blum, Fort Collins, CO (US); William Paul Heideman, Carr, CO (US); Dean Ginther, Greeley, CO (US); Jeffrey James Collins, Greeley, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 176 days.

(21) Appl. No.: 10/038,740

(22) Filed: Jan. 3, 2002

(65) Prior Publication Data

US 2003/0157429 A1 Aug. 21, 2003

(51) Int. Cl.$^7$ ............................................... G03F 7/038
(52) U.S. Cl. .................. 430/302; 430/350; 430/394; 430/434; 430/494; 430/944; 430/945; 101/453; 101/463.1; 101/467
(58) Field of Search ........................... 430/270.1, 278.1, 430/302, 350, 394, 401, 434, 494, 944, 945, 964; 101/463.1, 467, 453

(56) References Cited

U.S. PATENT DOCUMENTS

| | | | |
|---|---|---|---|
| 4,020,762 A | 5/1977 | Peterson | 101/467 |
| 4,356,254 A | 10/1982 | Takahashi et al. | 430/296 |
| 4,708,925 A | * 11/1987 | Newman | 430/270.1 |
| 4,927,741 A | 5/1990 | Garth et al. | 430/309 |
| 5,340,699 A | 8/1994 | Haley et al. | 430/302 |
| 5,372,907 A | 12/1994 | Haley et al. | 430/157 |

(List continued on next page.)

FOREIGN PATENT DOCUMENTS

| | | |
|---|---|---|
| JP | 1997000366147 | 7/1999 |
| JP | 1998000260396 | 3/2000 |
| JP | 1999000068430 | 9/2000 |

Primary Examiner—Rosemary Ashton
Assistant Examiner—Barbara Gilliam
(74) Attorney, Agent, or Firm—RatnerPrestia

(57) ABSTRACT

A method for imaging patterning compositions comprising the steps of:

(1) providing at least one patterning composition layer on a substrate; said patterning composition comprising:
  (a) at least one acid generator;
  (b) at least one cross linking resin or compound;
  (c) at least one binder resin comprising a polymer containing reactive pendant group selected from group consisting of hydroxyl, carboxylic acid, sulfonamide, active imide, alkoxymethylamides and mixtures thereof; and
  (d) at least one infrared absorber;
(2) imagewise exposing the patterning composition layer to actinic radiation;
(3) treating the imaged patterning composition layer with heat energy to treat the imaged portions of the composition layer;
(4) flood exposing the heat-treated, imaged patterning composition layer with UV light for a predetermined time, said time being sufficient to promote the effective clear-out of non-imaged portions during the developing step without causing substantial deterioration of the imaged portions; and
(5) developing the flood exposed, heat-treated imaged patterning composition with an aqueous alkaline developer to remove the non-imaged areas of the patterning composition layer and leaving the imaged areas substantially unaffected.

15 Claims, 2 Drawing Sheets

U.S. PATENT DOCUMENTS

| | | | |
|---|---|---|---|
| 5,380,622 A | | 1/1995 | Roser .......................... 430/325 |
| 5,491,046 A | | 2/1996 | DeBoer et al. ............. 430/302 |
| 5,631,119 A | | 5/1997 | Shinozaki ................... 430/326 |
| 6,083,658 A | * | 7/2000 | Kunita et al. ............ 430/270.1 |
| 6,218,083 B1 | * | 4/2001 | McCullough et al. ....... 430/326 |
| 6,458,511 B1 | * | 10/2002 | Wittig et al. ................. 430/302 |
| 6,461,795 B1 | * | 10/2002 | McCullough et al. ....... 430/302 |
| 6,489,078 B1 | * | 12/2002 | Van Damme et al. ...... 430/170 |
| 6,599,676 B2 | * | 7/2003 | Savariar-Hauck et al. ............ 430/270.1 |

* cited by examiner

METHOD AND EQUIPMENT FOR USING PHOTO- OR THERMALLY IMAGABLE, NEGATIVELY WORKING PATTERNING COMPOSITIONS

BACKGROUND OF THE INVENTION

1. Field of the Invention

The present invention relates to a method and an equipment for preparing photo- or thermally-imagable, negative working patterning compositions.

2. Brief Description of Art

Thermally sensitive, negative working printing plates are generally made with patterning compositions that are imaged on a substrate. These patterning compositions commonly contain light-sensitive material that is a mixture of an acid generator, a cross-linking resin or compound, a binder resin and an infrared (IR) absorber. The thermal sensitivity of the resulting printing plate enables them to function, but for some new applications, may be detrimental to their performance, processability and shelf life. For instance, in digital laser imaging applications, the window of operation of these commonly used patterning compositions was found to be dependent on the amount of heat these compositions were exposed to during the imaging process. When inadequate levels of heat were applied to the imaged areas during IR or UV/visible radiation imaging, then incomplete image formation or weak images may result on the printing press. If the non-imaged areas of patterned compositions were exposed to either extreme temperatures for short periods or to prolonged times of moderate heat during standard processing, storage or shipping of the printing plates, then these non-imaged areas may be difficult to be removed with standard developing techniques. The use of digital laser imaging technology, which employs higher power (and greater thermal energy) than previous used imaging equipment, has accentuated these undesirably effects and therefore decreased this window of operation.

The Kodak Polychrome Graphics Computer to Plate All-In-One (CTP1) printing plate machine available from Kodak Polychrome Graphics of Norwalk, Conn. was designed to provide the printing plate market with a single piece of equipment possessing all necessary components for the processing of printing plates utilizing a patterning composition in an expedient manner while at the same time having small footprint. The CTP1 has successfully accomplished this desired result, but its window of operation is not as wide as desired. The CTP1 printing plate machine is described in U.S. patent application Ser. No. 09/573,126, filed on May 17, 2000.

Other references that further show the state of the thermal plate and other printing plate arts include the following:

U.S. Pat. No. 4,020,762 (Peterson) teaches making an imaged planographic printing plate that employs a patterning layer containing a diazo sensitizer, carbon particles and a self-oxidating binder (e.g. nitrocellulose). Portions of the patterning layer are ablatively imaged by means of laser beam, followed by flood exposing the plate (and imaged patterning layer) with UV light and then developing the plate to cause the imaged areas struck by the laser to accept ink and the non-image areas to accept water. This U.S. patent does not incorporate a preheating step in its process.

U.S. Pat. No. 4,356,254 (Takahashi et al.) is directed to an image-forming method wherein a light-sensitive material comprising a support having a light-sensitive layer provided on the support. The light-sensitive layer containing a quinonediazide sensitizer. This light-sensitive material is imagewise exposed with a high intensity energy beam (e.g. a laser beam) to make the o-quinonediazide compound alkaline soluble in those areas that are imaged; then overall heating the light-sensitive material to insolubilize the exposed areas; then overall exposing (flood exposing) the thus-processed material with light to solubilize unexposed areas; and then developing with an alkaline developer to provide a negative image by removing alkaline soluble areas of said layer. This reference does not teach employing acid generator-type light sensitive layers.

U.S. Pat. No. 4,356,254 (Stahlhofen et al.) describes a process for producing negative relief copies using a light-sensitive material that contains either a benzoquinone diazide compound or a naphthoquinone diazide compound. This process includes the steps of imagewise exposing the light-sensitive material; then heating the light-sensitive material; then flood exposing the thus processed material which is followed by developing the material, whereby the layer areas which were not struck by light in the first imagewise exposure are washed off. This reference uses quinone diazides as the sensitizers in the light-sensitive material and does not teach the use of acid generator-type sensitizer.

U.S. Pat. No. 4,927,741 (Garth et al.) describes a method for the reversal of photosoluble lithographic printing plates having an aromatic quinone diazide-containing coating. This method includes the steps of (1) imagewise exposing a portion of the coated surface with UV lamp to render that portion soluble in a developer; (2) heating the plate and coating to render the imagewise exposed relatively insoluble in the developer; (3) then overall irradiating the coated surface to solubilize the remaining portion of the coated surface not previously exposed, wherein the overall irradiation step (3) is applied through water. This process does not teach the use of acid generator-type sensitizers, but instead is limited to quinone diazide sensitizers.

U.S. Pat. No. 5,380,622 (Roser) describes the production of negative relief copies of a recording plate that uses naphthoquinone diazide compounds as the photosensitive compounds. This process includes the step of: (1) imagewise exposing the recording plate using UV, metal halide, xenon or arc lamps; (2) then heating the exposed plate; (3) then uniform exposing the plate to the same light source used in the imagewise exposure; and (4) then developing the thus-processed recording plate with an aqueous alkaline developer to dissolve the alkali-soluble components and form a negative relief copy. This process also does not teach the use of acid generator-type sensitizers, but is limited to quinone diazide sensitizers.

U.S. Pat. No. 5,631,119 (Shinozaki) teaches an image formation process that employs photosensitive composition layer containing a quinone diazide photosensitizer and includes the steps of: (1) exposing the entire surface (flood exposing) of the photosensitive composition layer, to light rays (normally at 290 to 500 manometers) that render the quinone diazide compound soluble in an alkaline developer; (2) then imagewise heating the flood exposed photosensitive composition layer (such as with a thermal head printer); and (3) then developing with an aqueous alkaline solution.

Japanese Published Patent Application No. 11190902 A2 (Kunio) teaches making a heat mode recording lithographic printing plate having a image forming layer containing a quinone diazide compound and an infrared absorber. This plate is formed by (1) imagewise exposing the image forming layer with laser beams; (2) then flood exposing it to ultraviolet rays; and (3) then developing it with an aqueous alkaline developer.

Japanese Published Patent Application No. 267266 A2 (Mitsumasa) teaches a method for making lithographic printing plates that includes the steps: (1) imagewise exposing a photosensitive layer to visible laser beams; (2) then developing the imagewise exposed photosensitive layer; and (3) then flood exposing the developed photosensitive layer to UV light.

Japanese Published Patent Application No. 089478 A2 (Yasuo) teaches a method for making a photopolymerizable printing plate wherein a photosensitive layer is imagewise exposed to specified exposure light using a laser, then developed and then flood exposed to light at least 100 times the quantity employed in the imagewise exposure.

Accordingly, there is a need for a processing improvement that will widen the window of operation of these standard patterning compositions particularly in equipment such as the Kodak Polychrome Graphics CTP1 printing plate machine, thereby increasing their shelf life, processability, chemical resistance and the performance of printing plates that employ such patterning compositions. The present invention provides an excellent solution to that need.

BRIEF SUMMARY OF THE INVENTION

Therefore, one aspect of the present invention is directed to a method for imaging patterning compositions comprising the steps of:

(1) providing at least one patterning composition layer on a hydrophilic substrate which can be used as a lithographic base; said patterning composition comprising:
(a) at least one thermally activated acid generator;
(b) at least one cross linking resin;
(c) at least one binder resin comprising a polymer containing reactive pendant group selected from group consisting of hydroxyl, carboxylic acid, sulfonamide, active imide, alkoxymethylamide and mixtures thereof; and
(d) at least one infrared absorber;

(2) imagewise exposing the patterning composition layer to actinic radiation;

(3) treating the imaged patterning composition layer with heat energy to treat the imaged portions of the composition layer;

(4) flood exposing the heat-treated, imaged patterning composition layer with UV light for a predetermined time, said time being sufficient to promote the effective clear-out of non-imaged portions during the following developing step (5) without causing substantial deterioration of the imaged portions; and (5) developing the flood exposed, heat-treated, imaged patterning composition with an aqueous alkaline developer to remove the non-imaged areas of the patterning composition layer and leaving the imaged areas substantially unaffected.

A second aspect of the present invention is directed to an assembly for imaging patterning compositions comprising:

(A) a hydrophilic substrate which can be used as a lithographic base and having at least one patterning composition layer thereon, said patterning composition comprising:
(i) at least one thermally activated acid generator;
(ii) at least one crosslinking resin;
(iii) at least one binder resin comprising a polymer containing reactive pendant group selected from the group consisting of hydroxyl, carboxylic acid, sulfonamide, active imide, alkoxymethylamide and mixtures thereof,
(iv) at least one infrared absorber;

(B) source of actinic radiation;

(C) means for imagewise-exposing the patterning composition layer with actinic radiation;

(D) means for heat-treating the imaged patterning composition layer;

(E) source of UV radiation;

(F) means for flood exposing the heat-treated, imaged patterning composition layer with the UV radiation;

(G) means for developing the flood exposed, heat-treated, imaged patterning composition layer to remove the non-imaged areas of the patterning composition and having the imaged areas substantially unaffected.

The method of the present invention widens the window of operation of standard used patterning compositions used in making thermally sensitive printing plates. In particular, this method will improve the Kodak Polychrome Graphics CTP1 processing system. The CTP1 system is a single piece of equipment that possesses all necessary components for making printing plates using standard patterning compositions. This method of the present invention will significantly open the window of the operation of the CTP1 processing system without changing it through-put or its footprint.

DETAILED DESCRIPTION OF THE INVENTION

Figure 1:
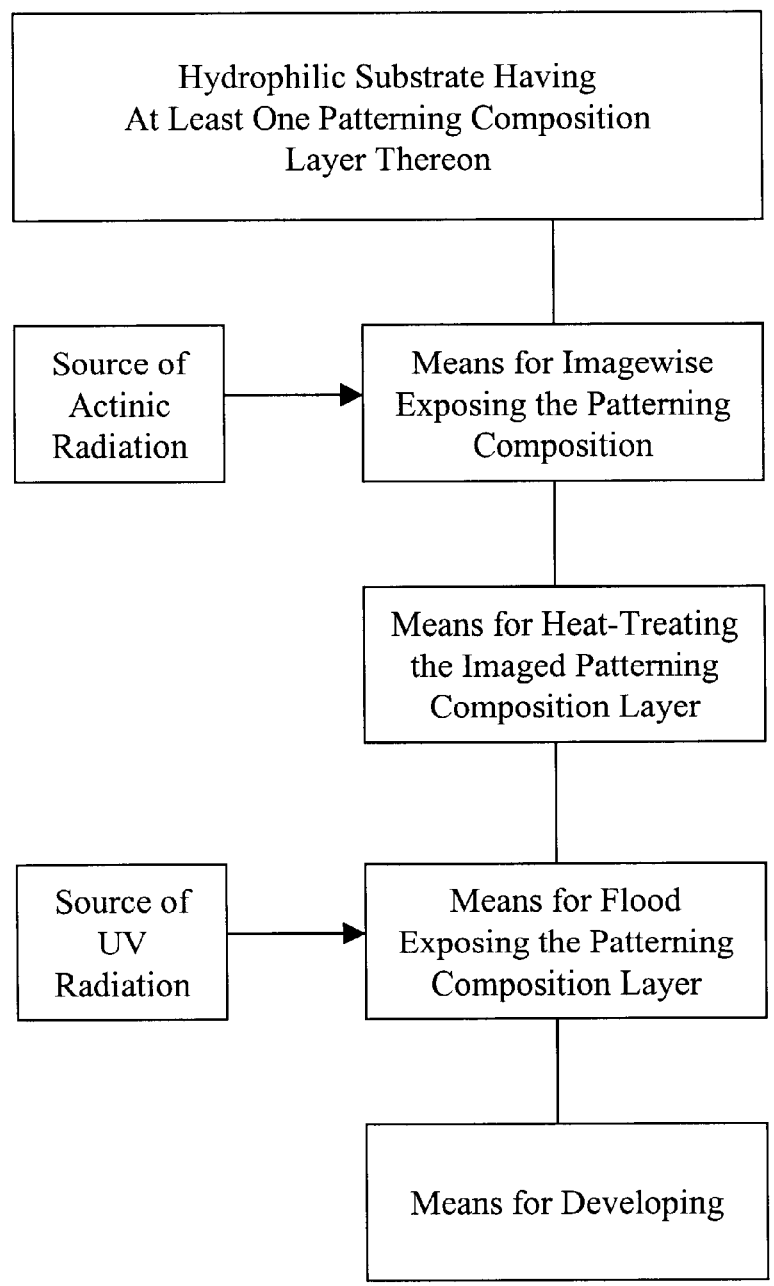
FIG. 1 is a flow chart describing the assembly for imaging the patterning composition of the present invention.

The first step of the present process is providing a patterning composition layer on a substrate. The preferred patterning compositions comprise a mixture of the following components:

(a) a thermal-activated acid generator;
(b) a cross linking resin;
(c) a binder resin comprising a polymer containing reactive pendant groups selected from hydroxyl, carboxylic acid, sulfonamide, an active imide and alkoxymethylamide and mixtures thereof;
(d) an IR absorber; and
(e) optionally, a UV/visible radiation activated acid generator for UV/visible sensitization.

Prior art disclosing such imageable compositions include U.S. Pat. No. 5,919,601 (Nguyen et al.), which is incorporated herein by reference in its entirety.

The supporting substrate to be used as the lithographic base in the present invention is a dimensionally stable plate-like substance, and examples thereof include paper, paper laminated with a plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-described metals.

A polyester film or an aluminum plate is preferable as a substrate in the present invention. In particular, an aluminum plate is particularly preferable since it has good dimensional stability and can be provided at a relatively low cost. Examples of preferable aluminum plates include pure aluminum plates and alloy plates comprising aluminum as the main component and trace quantities of different elements. Furthermore, plastic films at which aluminum is laminated or deposited can also be used. Examples of different elements which may be included in the aluminum alloy include silicon, iron, manganese, copper, magnesium, chrome, zinc, bismuth, nickel, and titanium. The amount of the different elements in the alloy is preferably 10% by weight or less. As mentioned above, in the present invention, pure aluminum is particularly preferable as a substrate material. However, since production of a completely pure aluminum is difficult in terms of refining technology, that containing trace quantities of different elements can be used. In short, the composition of the aluminum plate to be applied in the present invention need not be specifically defined, and a known aluminum plate may be used. The thickness of the aluminum plate to be used in the present invention is from about 0.1 mm to 0.6 mm, preferably from 0.15 mm to 0.4 mm, and more preferably from 0.2 mm to 0.3 mm.

When an aluminum plate is used as a substrate, it is desirable to conduct roughening treatment prior to the coating with the polymeric first layer. Also, prior to this roughening of the aluminum plate, a degreasing treatment with a surfactant, an organic solvent, or an aqueous alkaline solution may be conducted to remove the rolling oil from the surface as needed.

The surface roughening treatment of an aluminum plate can be implemented using various methods, such as a mechanically roughening method, an electrochemically roughening method in which a plate surface is electrochemically dissolved, and a chemically roughening method in which a plate surface is selectively dissolved using chemicals. As the mechanical method, known methods such as a ball abrasion method, brush abrasion method, blast abrasion method, and buff abrasion method can be used. As the electrochemically roughening method, a method in which an alternating current or direct current is applied to a plate in an electrolytic solution containing a hydrochloric acid or nitric acid can be used. Further, a method combining both (electrochemical and mechanical) methods as disclosed in JP-A No. 54-63,902 can be used.

The aluminum plate to which a surface roughening treatment as described above has been applied may be further subjected, if necessary, to an alkaline etching treatment or a neutralizing treatment, followed by an optional anodizing treatment so as to improve the water retention property and the abrasion resistance property of the surface. As the electrolyte used in the anodizing treatment of the aluminum plate, various electrolytes that can form a porous oxide film may be used. In general, sulfuric acid, phosphoric acid, oxalic acid, chromic acid, or a mixture thereof can be used as the electrolyte. The concentration of the electrolyte is suitably adjusted according to the type of electrolyte.

The treatment conditions of the anodization may not be specified since they significantly change depending on the type of the electrolyte solution used. In general, appropriate treatment conditions include a concentration of the electrolyte solution from 1 to 80% by weight, a temperature of the electrolyte solution from 5 to 70° C., a current concentration from 5 to 60 ampere/dm$^2$, a voltage from 1 to 100 V, and an electrolysis time from 10 seconds to 5 minutes.

If the amount of a film produced by anodization is less than 1.0 g/m$^2$, durability of the plate may be insufficient, and scratches may be easily produced in a non-image portion of the planographic printing plate, thereby easily causing so-called "scratch toning" in which ink adheres to such scratches in printing.

After the anodizing treatment, a hydrophilicity-increasing treatment may be applied to the aluminum surface, if necessary. Examples of the hydrophilicity-increasing treatment to be used in the present invention include an alkaline metal silicate (such as an aqueous solution of sodium silicate) method as disclosed in U.S. Pat. Nos. 2,714,066, 3,181,461, 3,280,734 and 3,902,734. In this method, the support (aluminum plate) is treated by immersing or electrolyzing the support, in an aqueous solution of sodium silicate. Other examples include a method of treating the aluminum plate with potassium fluorozirconate disclosed in JP-B No. 36-22063 and a method of treating it with polyvinyl phosphonate disclosed in U.S. Pat. Nos. 3,276,868, 4,153,461 and 4,689,272.

The thermal-activated acid generator of the present invention promotes the matrix-forming reaction between the crosslinking resin and the binder resin, when the composition is exposed to a suitable radiation source. Thermal-activated acid generators suitable for use in the invention include, for example, straight or branched-chain $C_1$–$C_5$ alkyl sulfonates, aryl sulfonates, N–$C_1$–$C_5$ alkylsulfonyl sulfonamides, and salts containing an onium cation and a non-nucleophilic anion; and combinations thereof. Particularly useful aryl sulfonates include, for example, benzoin tosylate, 2-hydroxymethylbenzoin tosylate and 2,6-dinitrobenzyl tosylate. Particularly useful N-alkylsulfonyl sulfonamides include N-methanesulfonyl-p-toluene sulfonamide and N-methanesulfonyl-2,4-dimethylbenzene sulfonamide. Particularly useful salts include, for example, those in which the onium cation is selected from iodonium, sulphonium, phosphonium, oxysulphoxonium, oxysulphonium, sulphoxonium, ammonium and diazonium, and the non-nucleophilic anion is selected from tetrafluoroborate, hexafluorophosphate, hexafluoroarsenate, hexafluoroantimonate, triflate, tetrakis(pentafluoro-phenyl) borate, pentafluoroethyl sulfonate, p-methyl-benzyl sulfonate, ethyl sulfonate, trifluoromethyl acetate and pentafluoroethyl acetate. Preferred are salts wherein the onium cation is iodonium or ammonium. The thermal-activated acid generator is incorporated in the composition of the invention in an amount of from about 1 to 25, preferably 5 to 20, weight percent (based on the weight of the composition).

Another component of the radiation sensitive composition of this invention is a crosslinking resin. Preferably, the crosslinking resin is selected from resole resins, $C_1$–$C_5$ alkoxymethyl melamine and glycoluril resins, poly($C_1$–$C_5$-alkoxy-methylstyrene), poly($C_1$–$C_5$-alkoxy-methylacrylamide) derivatives and combinations thereof. More preferably, the crosslinking resin is a resole resin prepared from a $C_1$–$C_5$ alkylphenol and formaldehyde; a tetra $C_1$–$C_5$-alkoxymethyl glycoluril; polymers of (4-methoxymethylstyrene); (N-methoxymethyl) acrylamide; (N-iso-butoxymethyl)acrylamide; and butylated phenolic resins. The crosslinking resin is incorporated in the composition of this invention in an amount of from about 5 to about 40, preferably about 10 to about 25, weight percent (based on the weight of the composition).

Another component of the radiation sensitive composition of this invention is a binder resin. Preferably, the binder resin is one or more polymers capable of undergoing an acid-catalyzed condensation reaction with the crosslinking resin at a temperature in the range of about 60 to about 200° C. to form a crosslinked polymer. Suitable examples of such polymers include poly(4-hydroxystyrene), poly(4-hydroxystyrene/methylmethacrylate), novolac resin, poly(2-hydroxyethylmethacrylate/cyclohexylmethacrylate), poly(2-hydroxyethylmethacrylate/methylmethacrylate), poly(styrene/butylmethacrylate/methylmethacrylate/methacrylic acid), poly(butylmethacrylate/methacrylic acid), poly(vinylphenol/2-hydroxyethylmethacrylate), poly(styrene/n-butylmethacrylate/2-hydroxyethylmethacrylate/methacrylic acid), poly(styrene/ethylmethacrylate/2-hydroxyethylmethacrylate/methacrylic acid) and poly(N-methoxymethyl methacrylamide/2-phenylethyl methacrylate/methacrylic acid. The binder resin is present in an amount of about 20 to about 65, preferably about 30 to about 55, weight percent (based on the weight of the composition). While not wishing to be bound by theory, it is believed that the crosslinking and binder resins are co-reactive resins. The designations of "binder resin" and "crosslinking resin" may therefor be used interchangeably.

The radiation sensitive composition of this invention also requires, as a component, an infrared absorber to render the composition sensitive to infrared radiation and cause the printing plate to be imageable by exposure to a laser source emitting in the infrared region. The infrared absorber can be a dye and/or pigment. A wide range of such compounds is well known in the art and include dyes and/or pigments selected from triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments. Where a dye and/or pigment is employed as the infrared absorber, it is used in an amount from about 2 to about 30, preferably about 5 to about 20 weight percent (based on the weight of the composition).

As hereinabove explained, the radiation-sensitive composition of this invention may optionally be sensitized to UV/visible radiation by incorporating, as a component of the composition, a UV/visible radiation-activated acid generator. The incorporation of such acid generator renders a printing plate containing such composition imageable by a UV/visible radiation source. Suitable UV/visible radiation-activated acid generators may be selected from halo $C_1$–$C_5$ alkyl substituted 5-triazines and salts containing an onium cation and non-nucleophilic anion. U.S. Pat. No. 5,491,046, incorporated herein by reference in its entirety, describes halo $C_1$–$C_5$ alkyl substituted 5-triazines suitable for use as UV/visible radiation-activated acid generators in the present invention. U.S. Pat. No. 5,919,601, incorporated herein by reference in its entirety, describes other suitable UV/visible radiation-activated acid generators.

In the case where the UV/visible radiation-activated acid generator is a salt, the onium cation is preferably selected from iodonium, sulphonium, phosphonium, oxysulphoxonium, oxysulphonium, sulphoxonium, ammonium and diazonium, and the non-nucleophilic anion is preferably selected from tetrafluoroborate, hexafluorophosphate, hexafluoroarsenate, hexafluoroantimonate, triflate, tetrakis(pentafluorophenyl) borate, pentafluoroethyl sulfonate, p-methylbenzyl sulfonate, ethyl sulfonate, trifluoromethyl acetate and pentafluoroethyl acetate. If used, the UV/visible radiation-activated acid generator is preferably incorporated in the composition of this invention in an amount of from about 0.5 to about 10, preferably about 1 to about 5 weight percent, (based on the weight of the composition).

Other components which can optionally be incorporated in the composition of this invention include a UV/visible sensitizers; indicator dyes; or a secondary acid generators or combinations thereof. Examples of these optional ingredients are disclosed in U.S. Pat. No. 5,919,601.

The patterning composition is preferably prepared by adding the above-noted components to a suitable solvent or solvent combination to dissolve or disperse them in the solvent. Suitable solvents include methyl lactate, ethyl lactate, methyl ethyl ketone, diethyl ketone, ethylene dichloride, cyclohexanone, methanol, ethanol, propanol, methoxypropyl glycol (Dowanol PM) and water. These solvents are used alone or in combinations thereof.

The concentration of the above-noted solid components in the solvent is preferably from about 1 to about 50% by weight, more preferably from 3 to 30% by weight and most preferably from 5 to 20% by weight, of the solvent.

The patterning composition is coated onto the above-noted substrate by any known coating technique. Examples of such coating technology include rotation or spin coating, slot coating, wire bar coating, dip coating, air knife coating, roll coating, blade coating, curtain coating and the like. The preferred method is slot coating.

The patterning composition is preferably dried to a suitable temperature to remove excess solvent. This drying may be carried out in a hot air drier or infrared ray dryer or the like, preferably at temperatures from about 40° C. to about 150° C. for 30 seconds to 10 minutes.

The thickness of the resulting layer, after drying, on the support can vary widely, but it is typically in the range from about 0.5 to about 3 microns, more preferably, from about 1 to about 2 microns.

No other essential layers are provided on the substrate. In particular, there need be no protective or other type of layers over the patterning composition layer. Optional, but not preferred, antihalation layers may be disposed under the imaging layer, or on the backside of the support (such as when the support is a transparent polymeric film).

The second step of the present process subjected the patterning composition layer to sufficient actinic radiation to imagewise expose that layer. The actinic radiation may be any radiation that will image this layer, including infrared (IR), ultra-violet and visible light. Preferably it is preferred to use infrared light. The sensitive material is preferably exposed to infrared radiation (IR) by scanning a laser beam modulated by an image signal. This IR imaging may be carried out by well-known methods. For example, the patterning composition layer may be imaged with a laser or an array of lasers emitting modulated near IR or IR radiation in a wavelength region that is absorbed by the absorber. IR radiation, especially IR radiation in the range of 750 to 1200 nm, preferably about 800 nm to about 1125 nm, is typically used for imaging thermally imageable elements. Imaging is conveniently carried out with a laser emitting at about 830 or at about 1056 nm. The IR exposure energy is preferably from about 30 to about 500 mJ/cm$^2$; more preferably from about 30 to about 350 mJ/cm$^2$, and most preferably from about 50 to about 175 mJ/cm$^2$. Suitable commercially available imaging devices include imagesetters such as the Creo Trendsetter (CREO, British Columbia, Canada) and the Gerber Crescent 42T (GERBER, Brussels, Belgium). The time between the flood exposure and exposure with a laser can be somewhat prolonged. At ambient temperatures of about 10° to about 35° C., laser exposure can be postponed as long as 24 hours. At temperatures of about 0° to about 10° C. and preferably about 0° to about 5° C., the time between exposures may be a month.

The third step of the present process is subjecting the image patterning composition layer to sufficient heat energy to heat treat the imaged portions of the composition layer.

After the imagewise radiation or exposure, the patterning composition is heated. This heating operation can be effected by radiation, convection, contact with heated surfaces, for example, with rollers, or by immersion in a heated bath comprising an inert liquid, for example, water. The temperature range will be set around the fog point of the plate containing the patterning composition. The fog point is defined as the minimum amount of heat energy required to render a thermal plate non-processable. Preferably, the applied heat energy is ±50° F. from the fog point, more preferably ±30° F. from the fog point and most preferably ±15° F. from the fog point. The duration of heating can vary widely, depending on the method chosen for the application of heat as well as the other steps in the process. If a heat-transferring medium is used, the heating time will preferably be from about 30 seconds to about 30 minutes, more preferably from about 1 minute to about 5 minutes.

The fourth step of the present process is to subject the heat-treated, imaged patterned composition layer to overall or flood exposure with UV light for a predetermined time, said time being sufficient to promote the effective clear-out of non-imaged portions during the developing step without causing substantial deterioration of the imaged portions.

The preferred amount of flood exposure is dependent on the amounts of IR imaging radiation and heat the plate is exposed to as well as the type of developer used in its processing. The UV flood exposure range can be determined by monitoring the image integrity (see Example 6 below) at various levels of flood exposure for multiple combinations of the variables mentioned above. The following tradeoff/optimization conditions exist: (1) a high preheat temperature gives undesirable retention in background but provides additional beneficial crosslinking in image areas; (2) the UV flood step of this invention aids in solubilizing the non-imaged areas of patterning composition layer, thus helping to clear the background and keep the benefit of higher temperature preheat; (3) however, too high a UV dose will ultimately degrade the imaged areas of the patterning composition layer by insolubilizing those areas. Preferably, the overall exposure energy will be from about 5 to about 2500 mJ. As a light source of the UV radiation, it is possible to use a mercury lamp, a xenon lamp, a carbon arc lamp, a tungsten lamp, a fluorescent lamp and sunlight, and the like. Generally, light from any source that has a wavelength in the ultra violet range (preferably about 290 mn to about 500 nm) may be used.

A preferred embodiment of this invention would be its incorporation of a UV flood device into the Computer to Plate All-In-One (CTP1) processing machine as disclosed in U.S. patent application Ser. No. 09/573,126 filed on May 17, 2000.

The fifth step of the present process is developing the exposed patterned composition layer with an aqueous developing solution. The developing solution used for the development processing may be any liquid or solution that can penetrate and remove the unexposed regions without substantially affecting the complimentary exposed regions. While not being bound by any theory or explanation, it is believed that image discrimination is based on kinetic effect. The unexposed regions are removed more rapidly in the developer than the exposed regions. Development is carried for a long enough time to remove the unexposed regions in the developer, but not long enough to remove the exposed regions. The preferred time in the developer is from about 10 to 120 seconds. Hence the unexposed regions are described as being "soluble" or "removable" in the developer because they are removed, and dissolved and/or dispersed, more rapidly in the developer than the exposed regions.

Useful developers are aqueous solutions having a pH of about 7 or above. Preferred aqueous alkaline developers are those that have a pH between 8 and about 13.5, typically at least about 11, preferably at least about 12. Useful developers include commercially available developers such as PC9000, PC3000, PC955, PC592, Goldstar, Greenstar, Protherm, MX1710, and 956 aqueous alkaline developers each available from Kodak Polychrome Graphics LLC. Developers are described for example in Yamasue, U.S. Pat. No. 4,259,434, Seino U.S. Pat. No. 4,452,880, Miller U.S. Pat. No. 5,851,735, Eckler U.S. Pat. No. 5,998,102, Miro US EP-A-0732628, Toyama, GB-A-2276729 and Fiebag U.S. Pat. No. 6,143,479.

Development is typically carried out in a processor equipped with an immersion type developing bath, a section for rinsing with water, a gumming section, a drying section and a conductivity measuring unit. Typically the developer is applied to the imaged precursor by rubbing or wiping the element with an applicator containing the developer. Alternatively, the imaged precursor may be brushed with the developer or the developer may be applied to the precursor by spraying the element with sufficient force to remove the unexposed regions. In either instance, a printing plate is produced. Development may be carried out in a commercially available processor, such as a Mercury Processor and Quartz Processor (both from Kodak Polychrome Graphics). Preferably, the developer temperature is from about 10° C. to about 50° C., more preferably about 15° C. to about 35° C. Following development, the printing plate is rinsed with water and dried. Drying may be conveniently carried out by IR heaters or with hot air. After drying, the printing plate may be treated with a gumming solution. A gumming solution comprises one or more water soluble polymers, for example polyvinylalcohol, polymethacrylic acid, polymethacrylamide, polyhydroxyethylmethacrylate, polyvinylmethacrylate, gelatin and polysaccharide such as dextrin, pullulan, cellulose, gum arabic and alginic acid. A preferred material is gum arabic.

While post-development heating or other operation is normally not necessary for this invention, such operations may be preferred for some applications.

FIG. 1 is a flow chart that illustrates one preferred embodiment of the present invention.

The images obtained by the above described processing are suitable for many uses. For example, in the case of using a simple aluminum plate as the base, good prints are obtained by applying it to a printing machine after carrying out development. Further, a material prepared by providing a sensitive layer containing dyes on a transparent plastic film such as a polyester film can be used for correction of prints. In addition, it is possible to use photomasks, laser recording of output signals of computers and facsimile recording materials.

Moreover, the base of the developed sensitive material may be subjected to various processings according to the purpose. For example, in case of using a glass plate having a chromium vacuum deposition layer as the base, the chromium deposition layer is etched with a known etching solution containing ceric ion after the sensitive layer is developed to form a etching resist, and the resist layer is then removed, by which the base can be used as a hard mask. In case of using a silicon plate as the base, it is possible to make an etching resist of the silicon oxide layer or to use for a lift-off step. In case of using a copper foil plate for making a print circuit plate, it is possible to use as an etching resist or a plating resist after development.

The present invention is further described in detail by means of the following Examples and Comparisons. All parts and percentages are by weight and all temperatures are degrees Celsius unless explicitly stated otherwise.

EXAMPLES 1–9

The following equipment was used in Examples 1–9:
1) Wisconsin Heavy Duty Oven having a through-put speed of 2.5 feet per minute available from Wisconsin Oven Corporation of East Troy, Wis.
2) Mercury MKV Processor available from Kodak Polychrome having a through-put speed of 2.5 feet per minute and equipped with Protherm Concentrate Developer, available from Kodak Polychrome Graphics.
3) Olec Ultraviolet light frame utilizing an Olix integrator, available from Olec Corporation of Irvine, Calif.
4) OAI light meter, model 356, with a 400 nm sensor, available from OAI, Inc., Milpitas, Calif.

A calibration curve was developed for the purpose of estimating the UV flood energy in these examples. That curve was based on the equation y=12.68x−11.972 where $R^2=0.9976$ and y is the UV flood energy in $mJ/cm^2$ and x is the length of exposure in seconds.

Example 1

The Thermal Gold printing plate, available from Kodak Polychrome Graphics was used in the processing method presented above. Plate material, with dimensions of 24.5"×37.75"×0.012", were preheated in the Wisconsin Heavy Duty oven at a through-put speed of 2.5 ft/min and at temperatures of 281, 278, and 275° F. The plates were then processed in the Mercury MKV processor charged with Protherm Concentrate developer, available from Kodak Polychrome Graphics, at 25° C., to determine the minimum amount of heat (fog point) required to render the plate non-processable. The results were:

| Temperature | Result |
| --- | --- |
| 281° F. | non-processable (fog) |
| 278° F. | non-processable (fog) |
| 277° F., | clear-out of |
| 276° F. and 275° F. | background (clean) |

The temperature of 278° F. was determined to be the fog point of this plate material. A single plate of the dimensions stated above was then preheated at 273° F. (5° below fog) and cut into five 7"×2.45" samples. Each sample, except for the control that was not UV exposed, was placed onto the Olec UV light frame and subjected to increasing amounts of UV radiation by increasing the exposure time via the Olix integrator present on the machine. The exposure times were converted to an energy term ($mJ/cm^2$) using the calibration curve developed, with the aid of an OIA light meter, to relate time of exposure to energy (see above). After the UV flood exposure the samples were processed. Visual observation was performed to determine if any residual coating (fog) remained after processing. If observations suggested that no fog was present (clean) then an acetone drop test was carried out. The acetone drop test consists of placing a drop of acetone on the plate surface. As the drop of acetone spreads it will carry, due to the solubility of the patterning composition, any residual coating with it. If any residual coating is present it will form a residue (shoreline) on the perimeter of the acetone drop as it evaporates, thus allowing for an easier visual observation of any lack of clear out. It is worth noting that some levels of coating retention is acceptable before background scumming on press occurs. The results are presented below:

| UV Flood Energy $mJ/cm^2$ | Fog | Shoreline |
| --- | --- | --- |
| 0 (control) | clean | none |
| 51 | clean | none |
| 115 | clean | none |
| 178 | clean | none |
| 242 | clean | none |

At 5° below the fog point no residual or shoreline was noted on any of the parts.

Example 2

The procedures in this example are the same as those presented in Example 1 with the exception that the plates were preheated at the fog point temperature of 278° F. The results are presented below:

| UV Flood Energy $mJ/cm^2$ | Fog | Shoreline |
| --- | --- | --- |
| 0 (control) | heavy | X |
| 51 | clean | light |
| 115 | clean | none |
| 178 | clean | none |
| 242 | clean | none |

Flooding by ultraviolet radiation did clear out the fog, observed to be present on the control plate, at 51 $mJ/cm^2$ with light shoreline present after the acetone drop test. Clear out and no shoreline was observed at UV flood energies $\geq 115$ $mJ/cm^2$.

Example 3

The procedures in this example are the same as those presented in Example 1 with the exception that the plates were preheated at 283° F., 5° above the fog point temperature. The results are presented below:

| UV Flood Energy $mJ/cm^2$ | Fog | Shoreline |
| --- | --- | --- |
| 0 (control) | heavy | X |
| 51 | clean | moderate |
| 115 | clean | light |
| 178 | clean | light |
| 242 | clean | very light |

Apparent clear out of the heavy fog observed on the control occurred on all parts with the amount of shoreline decreasing as the UV flood energy increased.

Example 4

The procedures in this example are the same as those presented in Example 1 with the exception that the plates were preheated at 287° F., 10° above the fog point temperature. The results are presented below:

| UV Flood Energy mJ/cm² | Fog | Shoreline |
|---|---|---|
| 0 (control) | heavy | X |
| 51 | fog + redeposit | heavy |
| 115 | light fog + redeposit | heavy |
| 178 | light fog + redeposit | heavy |
| 242 | clean | light |

UV flooding failed to clear out fog and redeposit until 242 mJ/cm² of energy was applied and even at this point light shoreline was observed.

Example 5

The procedures in this example are the same as those presented in Example 1 with the exception that the plates were preheated at 293° F., 15° above the fog point temperature. The results are presented below:

| UV Flood Energy mJ/cm² | Fog | Shoreline |
|---|---|---|
| 0 (control) | heavy | X |
| 368 | fog + redeposit | X |
| 432 | fog + redeposit | X |
| 622 | fog + redeposit | X |
| 1129 | fog + redeposit | X |

The UV flood did attack the heavy fog observed on the control plate, however, even with 1129 mJ/cm² of energy applied, clear out was not observed. These results could represent a limit to the amount of thermal energy applied, even when employing the UV flood.

Example 6

Examples 6 to 10 demonstrate the effects of UV flood over exposure. The Thermal Gold printing plate, available from Kodak Polychrome Graphics, was utilized to examine the effects of the above-mentioned processing method on a digital image applied to the plate. Solid images, generated at various exposures, were created on 24.5"×37.75"×0.012" plate material using a program, contained on a Creo 3244 Trendsetter digital platesetter, that performs a drum speed series (100–230 rpm's increasing in 10 rpm increments) yielding exposure energies ranging from 58–133 mJ/cm². Once imaged the plate material was preheated 2° below fog, 275° F. and cut to four 6"×26" samples in a manner such that the range of solid images could be examined. Each sample was placed onto the UV light frame and subjected to increasing amounts of UV radiation by increasing the exposure time. After the UV flood exposure the samples were processed.

Visual observation was employed to determine the image quality of the solid area, i.e. banding due to incomplete crosslinking as a result of under exposure. An X-Rite model 408 densitometer, set to measure the cyan color, was then utilized to quantify the solid density (D-Max).

A common plate cleaning solution, Prisco Liquid Plate Cleaner (LPC) known to attack and remove the Thermal Gold coating after time, was drop-wise applied to the solid areas not exhibiting incomplete image banding, allowed to interact with the coating solution for 1 minute and then removed. The areas where the LPC was applied were then examined using the densitometer to give a qualitative measurement of image integrity. The results are presented below:

| Laser Exposure mJ/cm² | D-Max | Banding | Post LPC D-max |
|---|---|---|---|
| UV Flood Exposure: 51 mJ/cm² Shoreline: none | | | |
| 58 | 34 | yes | X |
| 61 | 34 | yes | X |
| 63 | 34 | yes | X |
| 67 | 36 | yes | X |
| 70 | 36 | yes | X |
| 74 | 62 | yes | X |
| 78 | 79 | yes | X |
| 83 | 89 | yes | X |
| 89 | 95 | no | 37 |
| 95 | 96 | no | 38 |
| 103 | 96 | no | 47 |
| 111 | 96 | no | 73 |
| 121 | 95 | no | 80 |
| 133 | 94 | no | 86 |
| UV Flood Exposure: 115 mJ/cm² Shoreline: none | | | |
| 58 | 34 | yes | X |
| 61 | 34 | yes | X |
| 63 | 34 | yes | X |
| 67 | 34 | yes | X |
| 70 | 34 | yes | X |
| 74 | 39 | yes | X |
| 78 | 51 | yes | X |
| 83 | 80 | yes | X |
| 89 | 93 | yes | X |
| 95 | 96 | yes | X |
| 103 | 98 | no | 44 |
| 111 | 97 | no | 67 |
| 121 | 97 | no | 79 |
| 133 | 95 | no | 82 |
| UV Flood Exposure: 178 mJ/cm² Shoreline: none | | | |
| 58 | 33 | yes | X |
| 61 | 34 | yes | X |
| 63 | 33 | yes | X |
| 67 | 33 | yes | X |
| 70 | 34 | yes | X |
| 74 | 39 | yes | X |
| 78 | 52 | yes | X |
| 83 | 79 | yes | X |
| 89 | 92 | no | X |
| 95 | 97 | no | X |
| 103 | 98 | no | 36 |
| 111 | 98 | no | 57 |
| 121 | 96 | no | 75 |
| 133 | 96 | no | 83 |
| UV Flood Exposure: 242 mJ/cm² Shoreline: none | | | |
| 58 | 33 | yes | X |
| 61 | 33 | yes | X |
| 63 | 33 | yes | X |
| 67 | 33 | yes | X |
| 70 | 33 | yes | X |
| 74 | 33 | yes | X |
| 78 | 41 | yes | X |
| 83 | 51 | yes | X |
| 89 | 72 | yes | X |
| 95 | 92 | yes | X |
| 103 | 96 | yes | 34 |
| 111 | 98 | no | 42 |
| 121 | 98 | no | 71 |
| 133 | 98 | no | 81 |

Based on the observations made and presented in Examples 1–5 no control plate to demonstrate the presence of fog without an overall UV flood exposure was made. The data presented above shows that as the amount of UV exposure increases the image integrity decreases.

Example 7

The procedure and results in this example are similar to those presented in Example 6 with the following differences: Preheat at 277° F., fog point

| UV Flood Exposure | Shoreline |
|---|---|
| 115 mJ/cm² | None |
| 178 mJ/cm² | None |
| 242 mJ/cm² | None |
| 305 mJ/cm² | None |

Example 8

The procedures and results in this example are similar to those presented in Example 6 with the following differences: Preheat at 282° F., 5° above fog point

| UV Flood Exposure | Shoreline |
|---|---|
| 242 mJ/cm² | Very light |
| 305 mJ/cm² | Very light |
| 368 mJ/cm² | Very light |
| 432 mJ/cm² | Very light |

Example 9

The procedures and results in this example are similar to those presented in Example 6 with the following differences: Preheat at 287° F., 10° above fog point

| UV Flood Exposure | Shoreline |
|---|---|
| 305 mJ/cm² | Moderate |
| 368 mJ/cm² | Light |
| 432 mJ/cm² | Light |
| 495 mJ/cm² | Light |

Example 10

Figure 2:
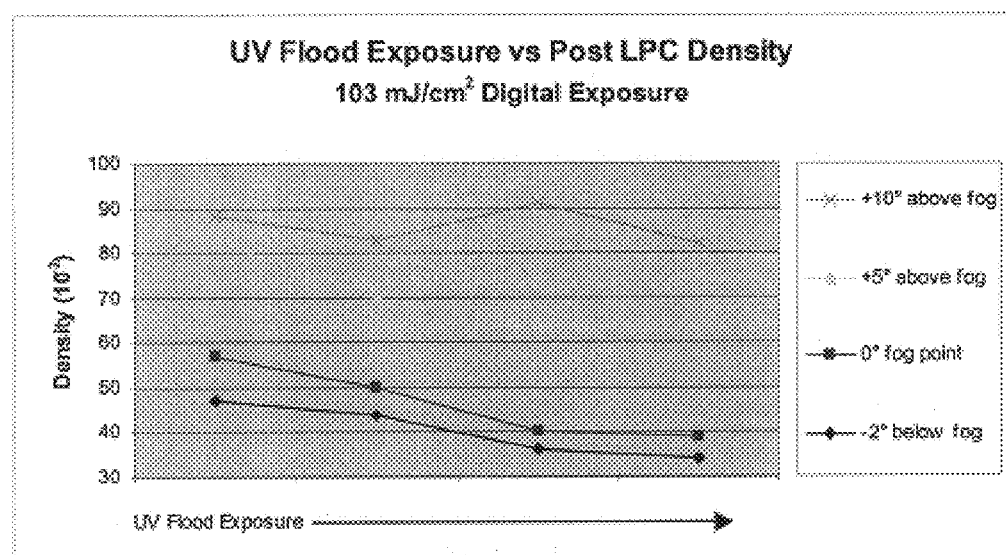
FIG. 2 is a graph, comparing the solid density and resistance to LPC in Examples 7 to 9.

This Example comprises a comparison of results obtained in Examples 7–9 above. FIG. 2 shows a comparison of the resistance to LPC of plate material preheated at 2° below fog point, at fog point, 5° above fog point, and 10° above fog point.

The graft in FIG. 2 shows that as the preheat temperature increases so does the solid density and resistance to LPC indicating a more complete, and therefore stronger, image. Recall however that also as temperature increased so did the amount of residual coating in the non-image areas, which in excess can lead to background scumming on press.

It is apparent from the data that an optimum condition exists where the preheat temperature and amount of UV flood exposure are balanced, resulting in a strong image and little to no residual coating.

Example 11

The Thermal Plate 830 printing plate, available from Kodak Polychrome Graphics, and the Computer-to-Plate All-in-One (CTP1) processor, also available from Kodak Polychrome Graphics, were utilized in the processing method mentioned above. The CTP1 processor is a device that incorporates the preheat, processing, and post baking devices in one compact machine. In order to use this device with the proposed processing method the addition of a UV light source was carried out. Four Voltarc FR38T12BL9DHO lamps, two 220V ballast lamp starters, a support frame holding the lamps approximately 5–7 inches from the plate surface, and an on/off switch were incorporated into the CTP1 processor between the preheat and processing sections such that no additional space was required for the addition.

The Thermal Plate 830 printing plates were imaged by both a traditional film, Olec UV light frame combination and a Creo 3244 Trendsetter digital platesetter. Imaged plate material was put through the CTP1 processor, at the standard operating preheat of 230° C., with the lamps off. This was the control plate. Imaged plate material was also processed at 10° and 15° above the standard operating preheat with the lamps either on or off. The energy of the UV lamp bank was measured to be 180 mJ/cm², at the distance of 5–7 inches, using the OAI model 306 UV power meter. The non-image areas of the plate were examined with a X-Rite 418 densitometer to determine the release or retention of the patterning composition. With aluminum substrate of these plates, the patterning composition is determined to be released when densities less than 36 are observed. Retention of the patterning composition is observed at densities greater than 37. Similar results were obtained for all samples and are summarized below:

| Lamps ON/OFF | Temperature ° C. | Background Density ($10^{-2}$) |
|---|---|---|
| OFF (control) | 230 | 32–34 |
| OFF | 240 & 245 | 70 |
| ON | 240 & 245 | 33 |

The UV lamps did remove the thermal fog from the non-image areas of the plate.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A method for imaging patterning compositions comprising the steps of:
   (1) providing at least one patterning composition layer on a substrate; said patterning composition comprising:
      (a) at least one acid generator;
      (b) at least one cross linking resin or compound;
      (c) at least one binder resin comprising a polymer containing reactive pendant group selected from group consisting of hydroxyl, carboxylic acid, sulfonamide, active imide, alkoxymethylamides and mixtures thereof; and
      (d) at least one infrared absorber;
   (2) imagewise exposing the patterning composition layer to actinic radiation;

(3) treating the imaged patterning composition layer with heat energy to treat the imaged portions of the composition layer;

(4) flood exposing the heat-treated, imaged patterning composition layer with UV light for a predetermined time, said time being sufficient to promote the effective clear-out of non-imaged portions during the developing step without causing substantial deterioration of the imaged portions; and (5) developing the flood exposed, heat-treated imaged patterning composition with an aqueous alkaline developer to remove the non-imaged areas of the patterning composition layer and leaving the imaged areas substantially unaffected.

2. The method of claim 1 wherein the imagewise exposing step (2) is conducted with infra-red radiation.

3. The method of claim 1 wherein the imagewise exposing step (2) is conducted with ultra-violet radiation.

4. The process of claim 1 wherein the hydrophilic substrate is an aluminum plate.

5. The process of claim 2 wherein the aluminum plate is anodized before the patterning composition is coated thereon.

6. The process of claim 1 wherein the at least one thermal-activated acid generators are selected from the group consisting of straight or branched-chain $C_1$–$C_5$ alkyl sulfonates, aryl sulfonates, N–$C_1$–$C_5$ alkylsulfonyl sulfonamides, salts containing an onium cation and a non-nucleophilic anion and combinations thereof.

7. The process of claim 1 wherein the amount of thermal-activated acid generator is from about 1 to 25 weight percent of the patterning composition.

8. The process of claim 1 wherein the at least one crosslinking resin is selected from the group consisting of resole resins, $C_1$–$C_5$ alkoxymethyl melamine and glycoluril resins, poly ($C_1$–$C_5$ alkoxy-methylstyrene), poly ($C_1$–$C_5$ alkoxy-methylacrylamide) derivatives and combinations thereof.

9. The process of claim 1 wherein the amount of crosslinking resin is from about 5 to about 40 weight percent based on the weight of the patterning composition.

10. The process of claim 1 wherein the at least one binder resin is one or more polymers capable of undergoing an acid-catalyzed condensation reaction with the crosslinking resin at a temperature in the range of about 60° C. to about 200° C. to form a crosslinked polymer.

11. The process of claim 1 wherein the amount of the binder resin is from about 25 to 65 weight percent based on the weight of the patterning composition.

12. The process of claim 1 wherein the at least one infrared absorber is selected from the group consisting of at least one dye, at least one pigment and mixtures thereof.

13. A process of claim 1 wherein the amount of the infrared absorber is from about 2 to about 30 weight percent based on the weight of the patterning composition.

14. The method of claim 1 wherein the patterning composition additionally comprises (e) a UV/visible radiation activated acid generator for UV/visible sensitization.

15. An assembly for preparing imaged patterning compositions comprising:

(A) a substrate having at least one patterning composition layer thereon, said patterning composition comprising:
  (i) at least one thermally activated acid generator;
  (ii) at least one crosslinking resin;
  (iii) at least one binder resin comprising a polymer containing reactive pendant group selected from the group consisting of hydroxyl, carboxylic acid, sulfonamide, active imide, alkoxymethylamides and mixtures thereof;
  (iv) at least one infrared absorber;

(B) source of actinic radiation;

(C) means for imagewise-exposing the patterning composition layer with actinic radiation;

(D) means for heat-treating the imaged patterning composition layer;

(E) source of UV radiation;

(F) means for flood exposing the heat-treated, imaged patterning composition layer with the UV radiation;

(G) means for developing the flood exposed, heat-treated, imaged patterning composition layer to remove the non-imaged areas of the patterning composition and having the imaged areas substantially unaffected.

* * * * *